United States Patent [19]

Wakamatsu

[11] Patent Number: 5,206,831
[45] Date of Patent: Apr. 27, 1993

[54] SERIAL ACCESS SEMICONDUCTOR MEMORY DEVICE HAVING A REDUNDANCY SYSTEM

[75] Inventor: Masataka Wakamatsu, Kanagawa, Japan

[73] Assignee: Sony Corporation, Tokyo, Japan

[21] Appl. No.: 620,080

[22] Filed: Nov. 30, 1990

[30] Foreign Application Priority Data

Nov. 30, 1989 [JP] Japan ................................. 1-311060

[51] Int. Cl.[5] ..................... G11C 11/34; G06F 11/20
[52] U.S. Cl. ............................... 365/200; 365/230.08; 371/10.3
[58] Field of Search ............... 365/200, 230.08, 189.07; 371/10.2, 10.3

[56] References Cited

U.S. PATENT DOCUMENTS 4,701,887 10/1987 Ogawa ................................. 365/200

FOREIGN PATENT DOCUMENTS 0172016 2/1986 European Pat. Off. .
0189576 8/1986 European Pat. Off. .
0243859 11/1987 European Pat. Off. .
0315157 5/1989 European Pat. Off. .
0315257 5/1989 European Pat. Off. .

Primary Examiner—Joseph A. Popek
Attorney, Agent, or Firm—Hill, Steadman & Simpson

[57] ABSTRACT

A serial access semiconductor memory device having a column redundant system employs a parallel-serial conversion circuit including a plurality of series connected flipflop circuits and a plurality of selectors provided between the flipflop circuit. At the selector associated unit the final stage of the flipflop circuits in the parallel-serial conversion circuit, defective data from a memory cell array are replaced to redundant data from the column redundant system without large scale circuitry and complicated control signals. An improved fuse ROM or an improved comparator is employed for the semiconductor memory device to control the switching from the defective data to redundant data. The fuse ROM employs a latch circuit for reducing stand-by current. The comparator employs a plurality of MOS transistors to compare effectively. The relation between the fuse ROM and the comparator provides a simplified circuit construction of an asynchronous multi-port device or a device having a plurality of memory blocks.

10 Claims, 8 Drawing Sheets

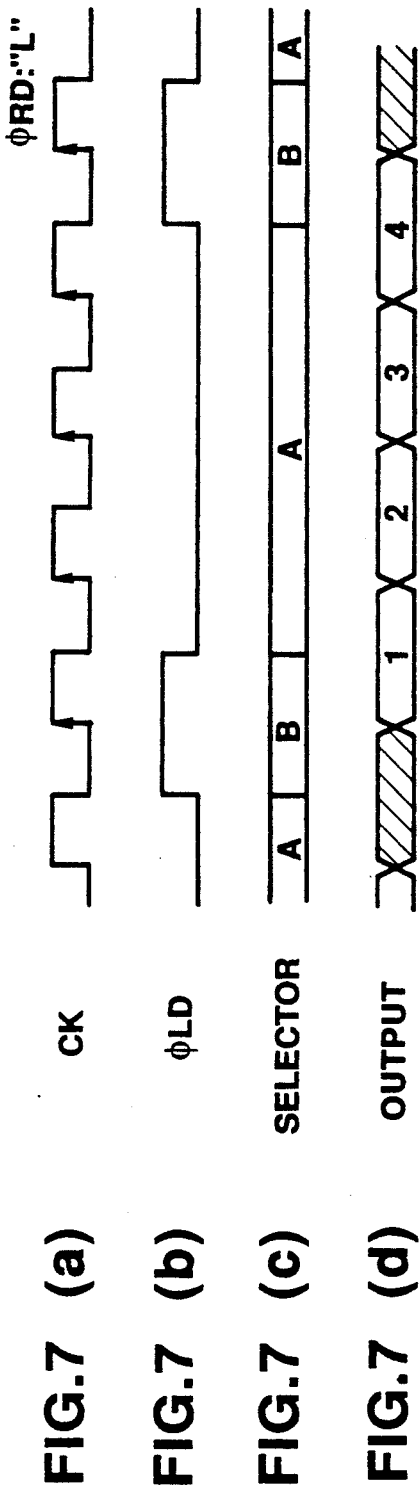
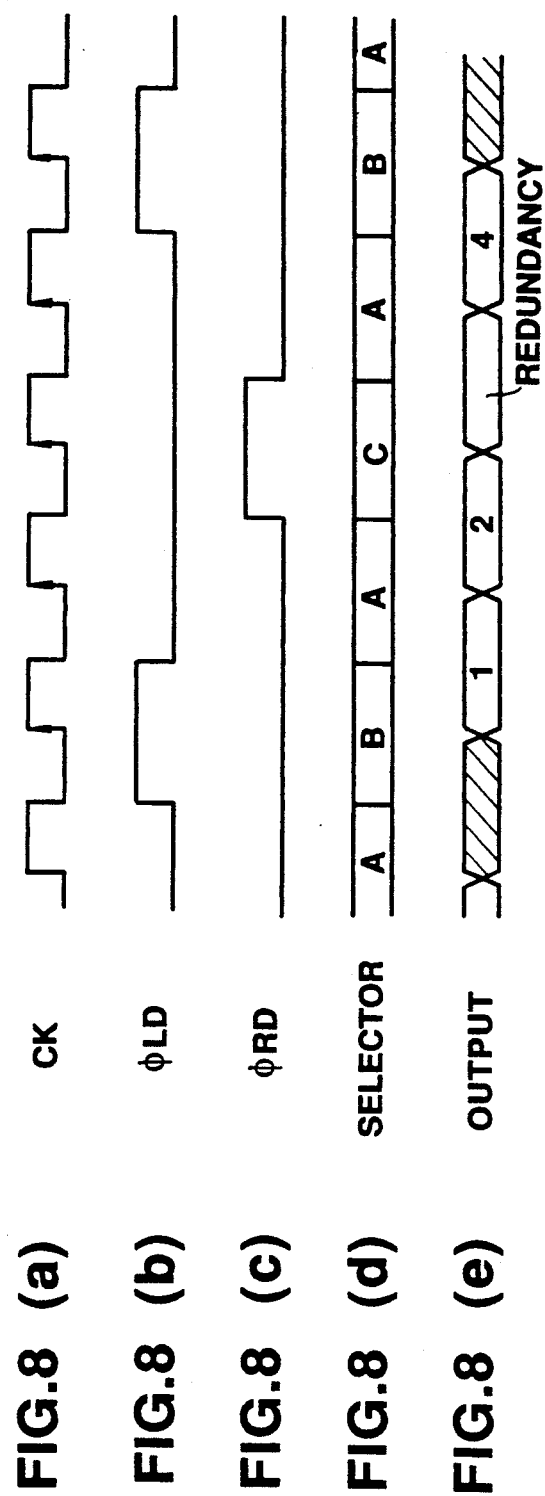

SERIAL ACCESS SEMICONDUCTOR MEMORY DEVICE HAVING A REDUNDANCY SYSTEM

BACKGROUND OF THE INVENTION

1. Field of the Invention

This invention relates to a serial access semiconductor memory device having a redundancy system, and particularly to a semiconductor memory device in which a column redundancy is employed for replacing defective data.

2. Description of the Prior Art

As a semiconductor memory device such as an video memory, there is known a memory device arranged to perform a serial inputting and outputting operation. The memory device performing such serial input-output operation usually has a serial memory (serial access port) of a word scale equal to the number of memory cells of a row of the memory core or a fraction thereof.

FIG. 1 shows an example of the memory device having the usual serial memory. In one portion of a memory cell array 101 having memory cells arranged in a matrix configuration, a row redundant section 102 and a column redundant section 103 are provided for substituting the defective bits and improving the yield. The row redundant section 102 is extended along the extending direction of the word line and Row-selected by a word line $WL_R$ selected by a row decoder 104. On the other hand, the column redundant section 103 is extended along the extending direction of the bit line. A usual word line WL is used for row selection of the column redundant section 103. Data on the memory cell array 101 are amplified by a sense amplifier 105 over bit line and inputted or outputted in parallel between the array and a serial memory 106. This serial memory 106 has the function of transiently storing data and of serial-parallel or parallel-serial conversion and is constituted by a plurality of stages of flip-flops with selectors connected in-between. The serial memory 106 is adapted to input or output data in series to or from the input-output circuit.

Meanwhile, with the memory apparatus provided with such serial memory, since data are inputted and outputted to or from the memory cell array in parallel, a problem is raised as to how data from the column redundant section 103 is to be exchanged. In connection with such problem, the present Applicant proposed a technique of exchanging the defective bits and the redundant bits in the column redundant section as disclosed in Japanese Patent Application No. 1(1989)-247828. According to this technique, a switching circuit is provided in a parallel data bus between the memory cell array and the serial memory to perform a switching between the column redundant section and the redundant bus.

In the technique of bus exchange, comparison between the defective address and the current address becomes necessary and an address comparator circuit is used for this purpose. The address comparator circuit for generating the exchange signal is constructed as shown for example in FIG. 2. This address comparison circuit is explained briefly. A plural of fuse 11 that may melt on laser irradiation are connected in parallel with a node 110, and a plural of MOS transistor 112, to each gate of which a read-out address signal or its complementary address signal is entered, are provided respectively between the grounding line and the other end of the fuse 111. Either the address side $\overline{A_0}$, $\overline{A_1}$ on the complementary side $A_0$, $A_1$ of the fuse 111 melts bit-by-bit in accordance with the defective address. The node 110 is connected to a source voltage Vcc via pMOS transistor 113, and is precharged to a source voltage Vcc when the pMOS transistor 113 is turned on by control signal $\phi P$. With this address comparator, the potential at the node 110 is maintained as it is, without being lowered, when the read-out address signal and its complementary address signal completely coincides with the melting pattern of the fuse 111. In case of non-coincidence, the potential at the node 110 is lowered due to discharging via fuse 111 and MOS transistor 112, so that the output of the inverter 114 is raised. This signal is supplied as the switching signal between the redundant bus and the parallel data bus.

In general, in a mega-bit class DRAM, redundancy of the order of four columns is effective and it becomes necessary to make a switching between a plurality of redundant columns. In an image memory, the multi-bit construction is a principle, so that, when it is considered that the parallel-to-serial conversion section is distributed on the chip, it is not always effective to make a switching between the parallel data bus and the redundant bus.

That is, in a technique of switching between the parallel data bus and the redundant bus, switching signals become necessary for its control, and an address comparison circuit making use of a fuse is necessitated for generating the switching signal. When two or more redundant columns are switched on the bus-to-bus basis, it becomes necessary to provide a number of switching circuits consistent with the redundant columns in series which number is equal to the number of the redundant columns. Therefore, the scale of the changeover circuit is drastically increased to complicate the generation of the switching signals. In case of a multi-bit construction, it becomes necessary to provide the switching circuit for each parallel-to-serial converting section to increase further the circuit scale.

When each serial memory of the video memory having a plurality of serial memories are to be operated asynchronously, the read-out or write address need to be compared to the defective address independently. In the case of utilizing the address comparator circuit shown in FIG. 2, the fuse 111 and the MOS transistor 112 to which the addresses are entered, are inseparable. An address comparator circuit need to be provided for each serial memory and the number of method fuse is also increased with the number of the serial memories.

SUMMARY OF THE INVENTION

It is an object of the present invention to provide a serial access semiconductor memory device in which a redundancy system is capable of switching of redundant columns without increasing the circuit scale.

It is another object of the invention to provide a serial access semiconductor memory device in which a comparator and a fuse ROM of a redundancy system operate effectively in the system and particularly operate in a multibit structure or in an asynchronous read/write memory device.

It is a further object of the invention to provide a fuse ROM in a redundancy system which has low standby current.

According to one embodiment the invention, there is provided a semiconductor memory device having a plurality of memory cells arranged in a matrix array of rows and columns, and a column redundant section including a plurality of memory cells for storing data in lieu of the defective memory cell of the array. One of the rows of the array and the column redundant section is selected by a row selector to output data from the memory cells in parallel in responsive to a readout address signal. The data outputted in parallel are transferred to a parallel-serial conversion circuit for reading out the data in serial. The parallel-serial conversion circuit has a plurality of flip-flop circuits connected in series, and a plurality of selectors provided between the flip-flop circuits for selecting data from the array and from the flip-flop circuit. The selector which is associated with final stage of the flip-flop circuits has a capability to select data not only from the array and the flip-flop circuit but also from the column redundant section so that the defective data is replaced by the redundant data. To control the selectors, a fuse read only memory which stores defective address signals and a comparator which compares the defective address signals with the readout address signals are provided. When the defective address signal coincide with the readout address signal, the selector associated with the final stage operates to switch from the defective data to the redundant data at the selector.

In another embodiment of the invention, a semiconductor memory device has a exclusive fuse read only memory for employing asynchronous comparators in common. In case of employing memory blocks, the number of the fuse read only memory is correspond to the number of the memory.

In a further embodiment of the invention, a comparator comprises a plurality of sets of a pair of MOS transistor. Each gate of MOS transistor is supplied with the defective address signal, readout address signal or theirs complemental signals.

In a particular embodiment of the invention, a fuse read only memory comprises a fuse meltable according to the defective address and a MOS transistor being controlled by the inverted level of the level between the fuse and the MOS transistor for reducing standby current.

BRIEF DESCRIPTION OF THE DRAWINGS

FIG. 7 is a timing chart for illustrating the usual readout operation of the parallel-serial conversion circuit of the above example;

FIG. 8 is a timing chart for illustrating the read out operation at the time of the redundant switching of the parallel-serial conversion circuit of the above example;

DESCRIPTION OF THE PREFERRED EMBODIMENT

A preferred embodiment of the invention will be hereinafter explained by referring to the accompanying drawings.

Figure 1:
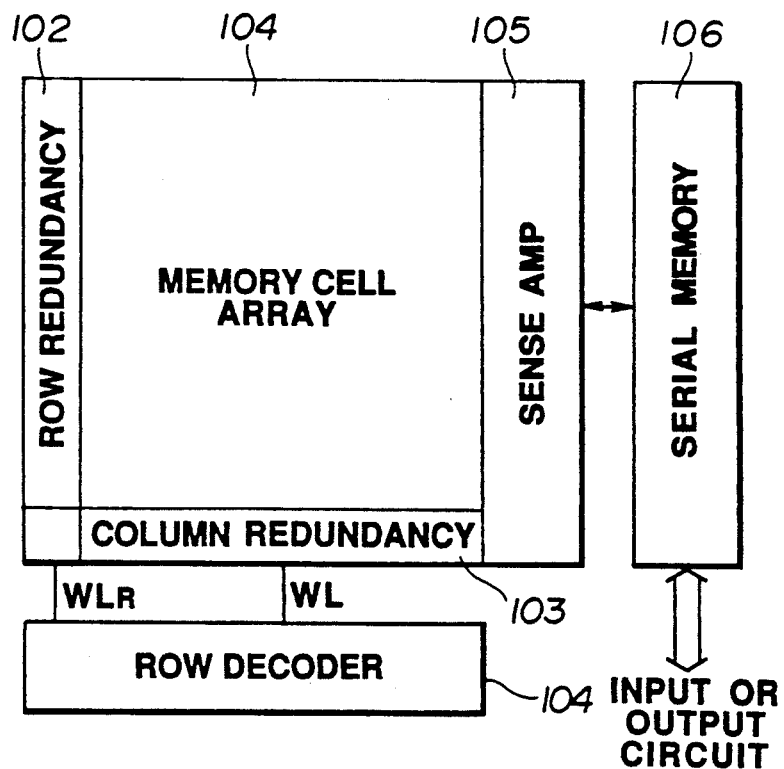
FIG. 1 is a block diagram of a conventional memory device having a serial memory and a redundancy system.
Figure 2:
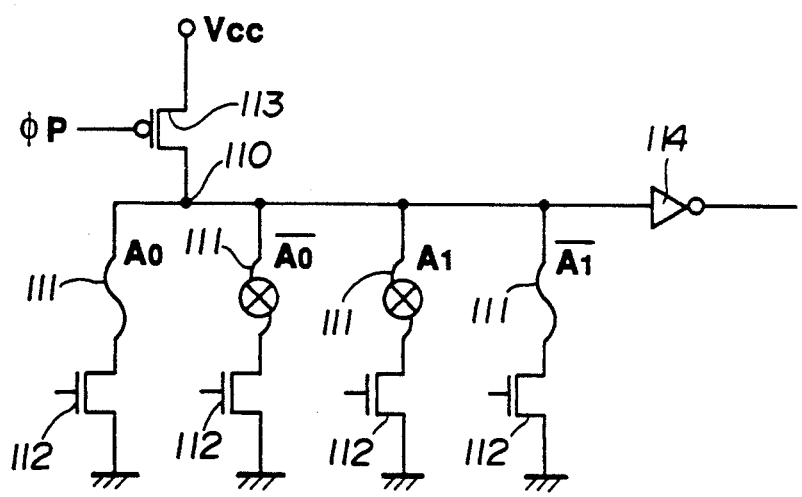
FIG. 2 is a circuit diagram of a conventional comparator.
Figure 3:
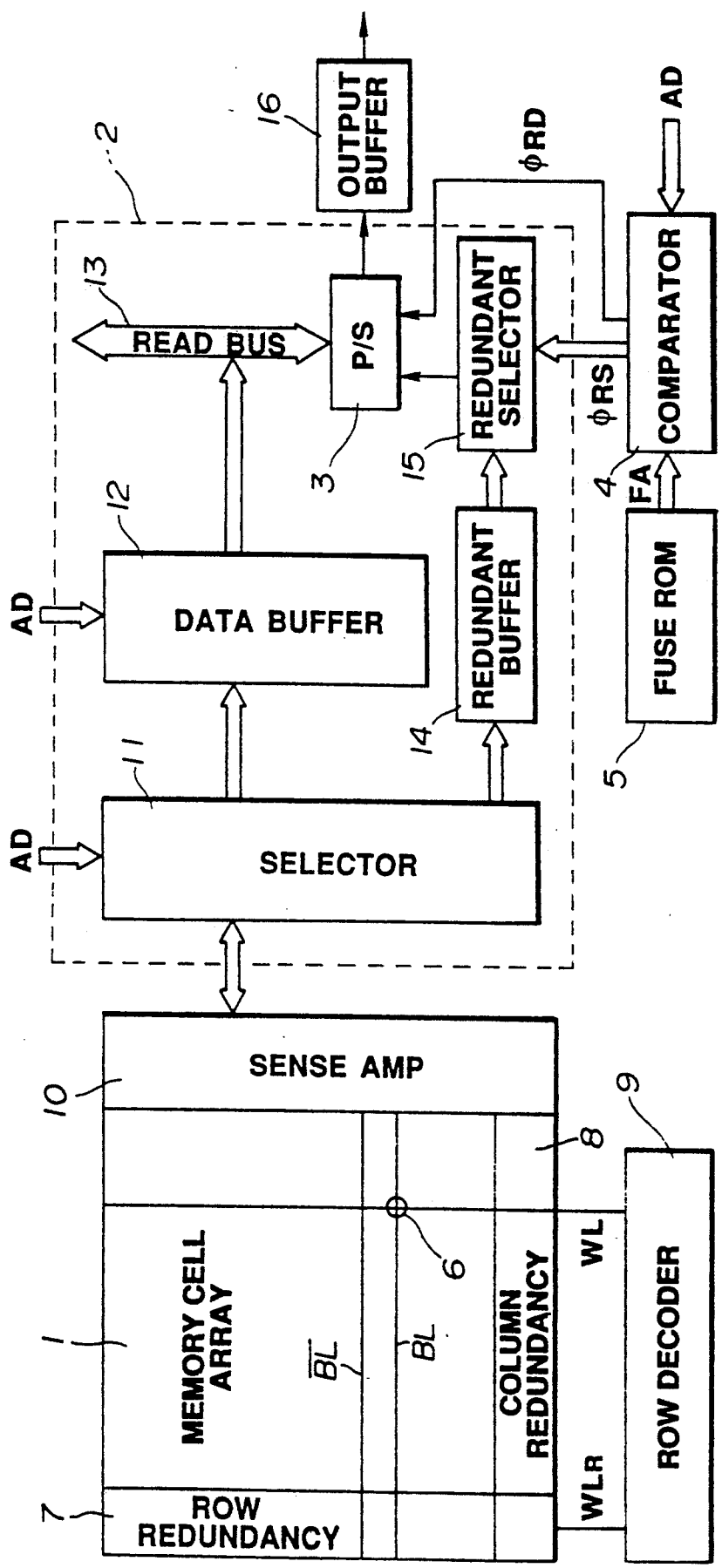
FIG. 3 is a block diagram showing an example of the memory device of the present invention.

Overall Arrangement of Memory Apparatus (FIG. 3)

As shown in FIG. 3, the semiconductor memory device of the present embodiment has a memory cell array 1 and a serial memory 2 capable of performing serial outputting. The memory cell array 1 is constituted by memory cells 6 arrayed in a matrix configuration. Although not shown, each memory cell 6 is a 1-transistor-1-capacitor DRAM cell. A row redundant section 7 and a column redundant section 8 are provided at a portion of the terminal end of the memory cell array 1. The row redundant section 7 is a circuit section for substitution for the defective memory cell of the memory cell array 1 and is provided for extending along the word line WL. The row of the defective memory cell is replaced by the row of the row redundant section 7. The column redundant section 8 is a circuit section for substitution for the defective memory cell of the memory cell array 1 as a row and is provided for extending along the direction of extension of the bit lines BL, $\overline{BL}$ which are substantially perpendicular to the word line WL. The row redundant section 7 is selected by a redundant word line $WL_R$ using a row decoder 9. The column redundant section 8 is selected by a word line WL adapted for selecting a usual memory cell 6 by a signal from a row decoder 9.

The memory cell array 1 is constituted by, for example, a folded bit line structure and one of paired bit lines BL, $\overline{BL}$ is used for reading or writing data of the memory cell 6 of one column, while the other is used for reference thereof. A sense amplifier 10 is provided at an end of memory cell array 1 to amplify the potential difference between the bit line pair BL, $\overline{BL}$. The paired bit lines BL, $\overline{BL}$ and the sense amplifier 10 are also used for reading or writing data of the column redundant section 8.

The data which are amplified or are to be amplified by the sense amplifier 10 are transferred between it and a selector 11. This selector 11 has the function of read/write switching that is the function of selecting the write data or the readout data, and is adapted for inputting and outputting data in parallel in either cases. This selector 11 has the function of column selection and a part of data transferred in parallel is selected as a function of the address signal AD. The read-out data from the selector 11 is selected in accordance with address signal AD. The read-out data from selector 11 is transiently stored in a data buffer 12. The data from column redundant section 8 is transferred via selector 11 in parallel to a redundant buffer 14. The redundant data from the column redundant section 8 are not sent to data buffer 12. The redundant data are transiently stored in the redundant buffer 14. Although the write data is not shown, data buffers or write buses are similarly used. A serial-parallel conversion circuit is employed between an input buffer circuit and a write bus. The column selecting function is not limited to that performed by both the selector 11 and the data buffer 12 and a construction comprising only one of them is allowable.

From this data buffer 12, data are read out sequentially in parallel to the four-line read bus 13 in accordance with the address signal AD. This read bus 13 is connected to a parallel-serial conversion circuit 3. As described subsequently, this parallel-serial conversion circuit 3 is constituted by a plurality of series-connected flipflop circuits. Switching between the defective data and the redundant data is performed in this parallel-serial conversion circuit 3. The data are converted in the parallel-serial conversion circuit 3 into serial data and switching between the defective data and the redundant data is performed, after which data are transferred to an output buffer 16 so as to be outputted to outside as serial output signal $D_{OUT}$.

The channel for sending redundant data to the parallel-serial conversion circuit 3 is from the redundant buffer 14 via a redundant selector 15. The redundant data are transferred from the redundant selector 15 to parallel-serial conversion circuit 3, with the transfer timing being controlled by a comparator circuit 4. Read-out address signals are entered into this comparator circuit 4 so as to be compared with the defective address signals FA from a fuse ROM 5. When the read-out address signal AD coincides with the defective address signal FA, a signal selecting redundant data is sent from the comparator circuit 4 to the redundant selector 15 and simultaneously a control signal $\phi RD$ controlling the switching is transmitted from comparator circuit 4 to parallel-serial conversion circuit 3. The fuse ROM is a circuit for causing the defective address signal FA of the memory cell array 1 to be stored in the fuse melting pattern. A concrete structural example of the comparator circuit 4 and the fuse ROM will be explained subsequently.

Figure 4:
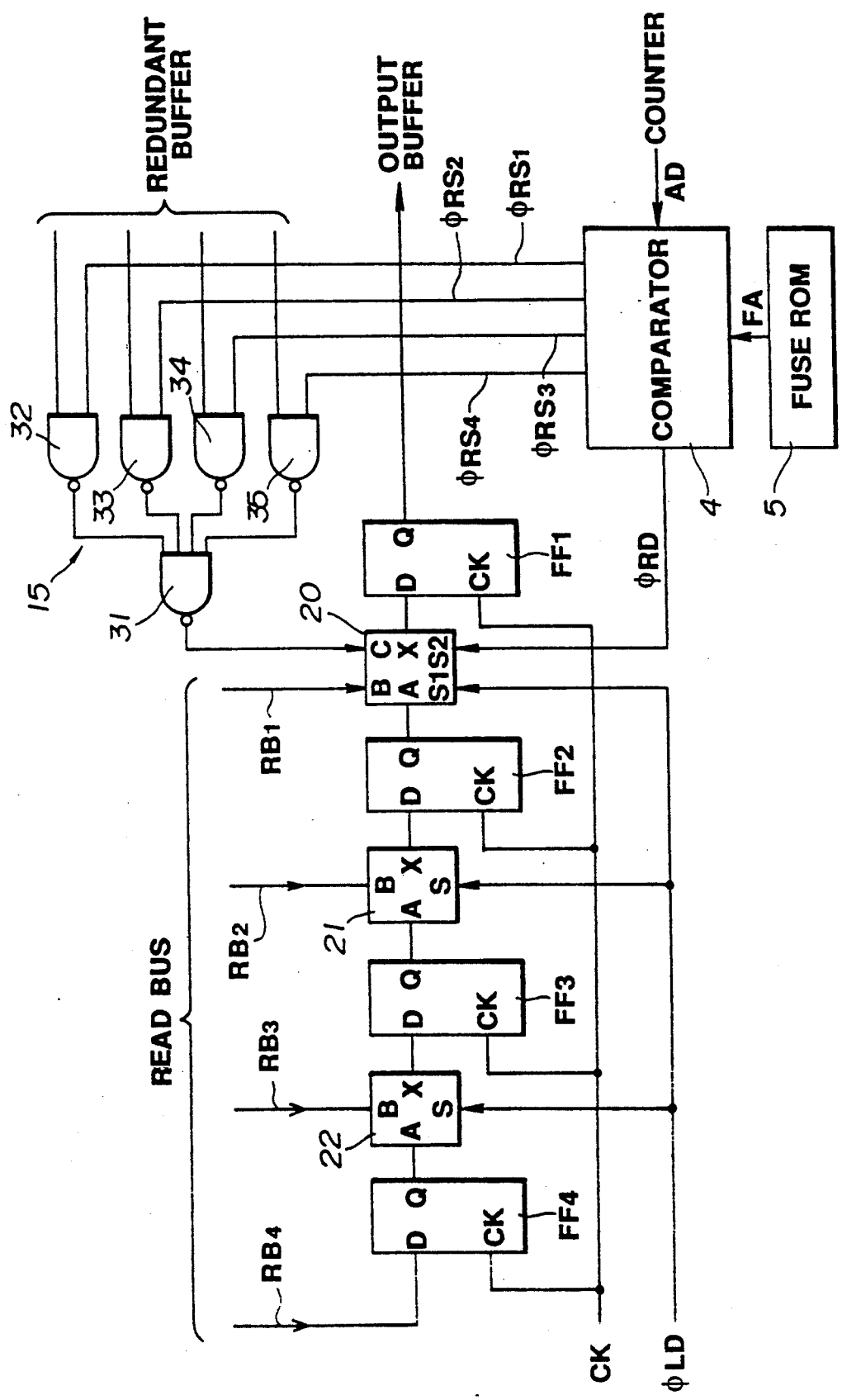
FIG. 4 is a circuit diagram showing serial-parallel conversion circuit of the example.
Figures 5, 6:
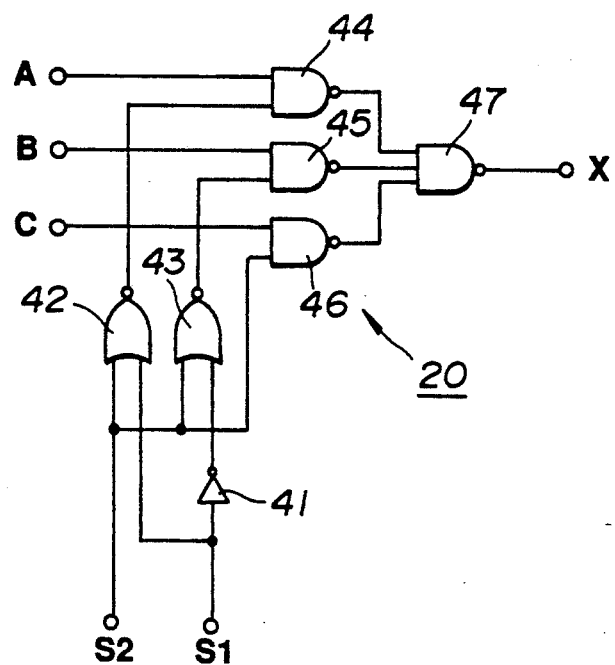
FIG. 5 is a circuit diagram showing an example of a three-input selector employed in the above example.
FIG. 6 is a view showing a switching table for the example of the three-input selector.

Structural Example of Parallel-Serial Conversion Circuit (FIGS. 4 to 6)

Referring to FIG. 4, a concrete circuit arrangement of mainly the parallel-to-serial conversion circuit 3 will be explained.

The parallel-serial conversion circuit 3 is comprised of four serially connected flipflop circuits FF1 to FF4, as shown in FIG. 4. These flipflop circuits FF1 to FF4 are D flipflops having an input terminal as the D terminal and the output terminal as the Q terminal. Each of the D flipflop circuits FF1 to FF4 is fed with clock signals CK from a clock generator, not shown. Each flipflop circuit FF1 to FF4 has selectors 20, 21, 22 connected between its Q terminal and the D terminal of the other flipflop circuit. These selectors 20 to 22 select whether or not the flipflop circuits FF1 to FF3 should fetch data from the read bus 13. Of these, the selector 20 provided at the inlet to the flipflop FF1 of the final stage switches between data from the flipflop circuit FF2, data from the read bus 13 or redundant data from the redundant selector 15, in order to enable switching with redundant data, to cause the selected data to be entered to the D terminal of the flipflop circuit FF1.

In more detail, a fourth line $RB_4$ of the read bus 13 is connected to the D terminal of the initial stage flipflop circuit FF4.

The terminal Q of this initial stage flipflop circuit FF4 is connected to a terminal A of selector 22. The terminal B of selector 22 is connected to third line $RB_3$ of the read bus 13. A signal controlling the selection is supplied to a terminal S of selector 22. When the signal $\phi LD$ is at "H" level, data from the read bus 13, that is data at terminal B, apparatus at a terminal X, that is an output terminal of the selector 22.

Conversely, when the signal $\phi LD$ is at "L" level, data from flipflop circuit FF4, that is data from the terminal A, appears at the terminal X, that is an output terminal of the selector 22. The terminal X of the selector 22 is connected to the terminal D of the next flipflop circuit FF3.

The terminal Q of the flipflop circuit FF3 is connected to the terminal A of the selector 21. The terminal B of the selector 21 is connected to the second line $RB_2$ of read bus 13. This selector 21 functions similarly to the selector 22 and switches inputs to terminals A and B by signal $\phi LD$ to output the selected input to terminal X. This terminal X of the selector 21 is connected to the terminal D of the flipflop circuit FF2.

The terminal Q of flipflop circuit FF2 is connected to the terminal A of the selector 20. The terminal B of the selector 20 is connected to the first line $RB_1$ of the read bus 13. The selector 20 has, in addition to terminals A and B, a terminal C, to which redundant data from the redundancy selector 15 as later described is entered. For switching the selector 20, signals are entered to terminals S1 and S2. The signal $\phi LD$ is entered to terminal S1, similarly to other selectors 21 and 22. The signal $\phi RD$ for switching to redundant data is entered to terminal S2.

FIG. 5 shows a more concrete circuit of the selector 20. The terminal S1 acts not only as an input terminal to a inverter 41 but also as an input terminal to a NOR circuit 42. A signal $\phi LD$ is supplied to this terminal S1. The output terminal of the inverter 41 is connected to one input terminal of a NOR circuit 43. The terminal S2 acts as a common input terminal to the NOR circuits 42, 43 and a NAND circuit 46. The output terminal of the NOR circuit 42 is connected to one input terminal of a NAND insert 44, the other input terminal of which is the terminal A. The output terminal of the NOR circuit 43 is connected to one input terminal of a NAND circuit 45. The other input terminal of the NAND circuit 45 is the terminal B. The NAND circuit 46, which has an S2 terminal as one input terminal, has a terminal C as the other input terminal. The output terminals of the NAND circuits 44, 45 and 46 are the input terminals of the NAND circuit 47, the output terminal of which is the X terminal.

The selector 20, having the above circuit construction, operates in accordance with the Table shown in FIG. 6.

First, when the signal $\phi RD$ supplied to the S2 terminal, is at the "L" level, the terminal connected to the X terminal is switched between terminals A and B, depending on the level of the signal φLD supplied to the terminal S1.

That is, when the terminal S2 is at the "L" level and the terminal S1 is at the "H" level, the output of the NOR circuit 43 is at the "H" level so that the NAND circuit 44 is in inactivated state, whereas the NAND circuit 45 is in activated state. The NAND circuit 46, directly connected to the S2 terminal, is in inactivated state. Thus the terminal B is connected to the terminal X via the NAND circuits 45 and 47.

When the S2 terminal is at "L" level and the S1 terminal is also at "L" level, the output of the NOR circuit 43 is at "L" level, so that the NAND circuit 44 is in activated state, and the NAND circuit 45 is in inactivated state. The NAND circuit 46, directly connected to the S2 terminal, is also in inactivated state. Thus the terminal A is connected to the terminal X via the NAND circuits 44 and 47.

When the S2 terminal is at "H" level, the outputs of the NOR circuits 42 and 43 are at "L" level, irrespective of the inputs at the S1 terminal. Both the NAND circuits 44 and 45 are in inactivated state and data of the terminals A and B are interrupted. Only the NAND circuit 46 is in activated state and the terminal C is connected to the terminal X via the NAND circuits 46 and 47.

In this manner, the 3-input selector 20 is controlled by signals φLD and φRD supplied to the terminals S1 and S2 to effect switching between data from the read bus 13, data which are transmitted serially and redundant data.

When the data entered to the flipflop circuit FF1 of the final stage are to be the redundant data, it suffices to set the signal φRD supplied to the terminal S2 to "H" level. This signal φRD is formed in the comparator 4 and is formed on the basis of the results of comparison of the defective address signal FA and the read-out address signal AD.

The comparator circuit 4 generates selection signals φRS$_1$ to φRS$_4$ for the redundant selector 15 simultaneously with signal φRD. Referring to the circuit construction of the redundant selector 15, it is so adapted that four redundant fuses from redundancy buffer 14 in association with 4 column redundancy, with each line of the redundant bus being connected to one input terminal of each of NAND circuits 32 to 35. To the other input terminal of the NAND circuit 32 is supplied a signal φRS$_1$ from comparator circuit 4. To the other input of the NAND circuit 32 is supplied a signal φRS$_1$ from the comparator circuit 4 and to the other input terminal of the NAND circuit 34 is supplied a signal φRS$_3$ from the comparator circuit 4. To the other input terminal of the NAND circuit 35 is supplied a signal φRS$_4$ from the comparator circuit 4. These signals φRS$_1$ to φRS$_4$ go to "H" level on the basis of the results of comparison at the comparator circuit 4 and only a redundancy bus line associated with the NAND circuit supplied with "H" level signal φRS is connected to the terminal C of selector 20 via the NAND circuit 31. Simultaneously, the signal φRD goes "H" and the signal appearing at X terminal of selector 20 is rendered the redundant data at terminal C to effect switching between the defective data and the redundant data.

Usual Read-out Operation (FIG. 7)

Now referring to FIG. 7, the usual read-out operation, that is the operation for the case in which redundant data substitution is not performed, is explained.

FIG. 7(a) shows a clock signal CK supplied to each of the flipflop circuits FF1 to FF4. Data entered to D-terminals of flipflop circuits FF1 to FF4 at the rising timing of the clock signal CK appear at the Q-terminals.

FIG. 7(b) shows a signal φLD for fetching the signal on read bus via the selector 20. This signal φLD goes periodically to "H" level during one clock among four clocks of the clock signal CK.

Now turning to the operation of the parallel to serial converter 3, signal φLD goes "H" and, during this time, the terminal X of selectors 20 to 22 are electrically connected to terminal B, as shown in FIG. 7(c). That is, data on the fourth line RB$_4$ of the read bus 13 are entered to the terminal D of the flipflop circuit FF4, data on the third line RB$_3$ of the read bus 13 are entered to the terminal D of the flipflop circuit FF3 via the selector 22, data on the second line RB$_2$ of the read bus 13 are entered to the terminal D of the flipflop circuit FF2 via the selector 21 and data on the first line RB$_1$ of the read bus 13 are entered to the terminal D of the flipflop circuit FF1 via the selector 20. With the rising of the clock signal CK during the time the signal φLD is at the "H" level, each data is outputted at the Q-terminal of each of the flipflop circuits FF1 to FF4 and, as output of FIG. 7(d), data on the first line RB$_1$ shown at "1" is transferred to an output buffer.

The signal φLD is changed from "H" level to "L" level and each of the selectors 20 to 22 is controlled for conducting the terminal A to the X-terminal. During the rising of the next clock signal CK, data on the second line RB$_2$ appear at Q-terminal of the flipflop circuit FF1 of the final stage. FIG. 7(d) shows the output as "2". Simultaneously, the output of the flipflop circuit FF2 is the data on the third line RB$_3$ while the output of the flipflop circuit FF3 is sequentially the data on the fourth line RB$_4$. Data are again shifted sequentially during the rising time of the clock signal CK and the output turns out to be the data on the third and fourth lines RB$_3$ and RB$_4$. In FIG. 7(d), data on the third line RB$_3$ are indicated at "3" while data on the fourth line RB$_4$ are indicated at "4".

After passage through four periods of the clock signal CK, signal φLD again rises from "L" level to "H" level, such that the data on the first to fourth lines RB$_1$ to RB$_4$ of the read bus 13 are loaded to a parallel-serial converter 3. Parallel to serial conversion is performed in the similar manner to transfer serial read-out data to an output buffer.

Read-out Operation during Redundancy Switching (FIG. 8)

Now referring to FIG. 8, an explanation is made for the case in which data on the third line RB$_3$ of the read bus 13 are the defective data and switching is to be made to the redundancy data.

Similarly to the case of FIG. 7, the signal φLD goes to the "H" level, as shown in FIG. 8(b), for the range which covers one half period before and after rising of the clock signal CK shown in FIG. 8(a). Then, as shown in FIG. 8(d), the inputs from the B terminals of the selectors 20 to 22 of the parallel to serial converter 3 appear at X-terminals, while data from the read bus 13 appear at X-terminals of the selectors 20 to 22. These data are transferred to the Q terminals of the flipflop circuits FF1 to FF4 with the rising of the clock signal CK during the time the signal φLD is at the "H" level. The output signal shown in FIG. 8(e) turns out to be the data on the first line RB₁ as shown at "1" in the drawing.

After the signal φLD goes to "L" level, data on the second line RB₂ is outputted at the final stage flipflop circuit FF1 with the rising of the next clock signal CK. At this stage, the defective data on third line RB₃ is transferred to the output of the flipflop circuit FF2 preceding the final stage while the defective data on the third line RB₃ is transferred to the D-terminal of the final stage flipflop circuit FF1. For switching the defective data, the signal φRD from the comparator 4 goes "H" as shown in FIG. 8(c). That is, the defective address signal FA corresponding to the defective data is stored in the fuse ROM 5 and is compared at the comparator 4 to the address signal AD from a counter. The signal φRD goes "H" in case of coincidence. Simultaneously, the comparator circuit 4 causes the control signals φRS₁ to φRS₄ of the redundant selector 15 to go alternately "H" to activate one of the NAND circuits 32 to 35 selectively to output redundancy data from the NAND circuit 31.

When the signal φRD is at "H" level, the C-terminal of the selector 20 is conducted to the X-terminal no matter what kind of signal is supplied to terminal S1. Hence, the redundant data from the NAND circuit 31 is transferred to the D-terminal of the final stage flipflop circuit FF1 via C- and X- terminals of the selector 20. This results in substitution of the redundant data for the previously transferred defective data. As a result, the substituted redundancy data appear at the Q-terminal of the the final stage flipflop circuit FF1 at the rising of the clock signal CK after going to "H" of signal φRD. This is shown as "redundancy" in FIG. 8(e). Then, similarly to the case of FIG. 7, data are transferred to the net flipflop circuit at the rising of the clock signal CK and read-out from the read bus 13 to parallel to the serial converter 3 is performed when the signal φLD at interval of 4-clock periods goes to "H" level.

With the above described circuit arrangement of the parallel-to-serial converter 3, 2 to 4 bit defective data on the same read bus 13 may be substituted without in any way increasing the circuit size. Thus it suffices to load the redundant data from the redundant selector 15 under control from the comparator 4 which raises the signal φRD to "H" level whenever the defective data to be substituted pass through the selector 20. When for example the first line RB₁ and the third line RB₃ on the read bus 13 are simultaneously defective data, signal φRD is simultaneously raised to "H" level at a clock which raises the signal φLD to "H" level and control is subsequently performed to raise the signal φRD to the "H" level after the two clocks. Substitution of the redundant data for defective data may be performed by controlling signals φRS₁ to φRS₄ simultaneously and loading the redundant data of the redundant bus from the NAND circuit 31.

Modification of Parallel-Serial Converter

The parallel-serial converter 3 shown in FIG. 4 includes plural series connected flipflop FF1 to FF4 and a selector 20 at an inlet to the final stage flipflop circuit FF1 to effect switching between the defective data and the redundant data.

Switching between the redundant data and the defective data is not limited to the inlet of the final stage flipflop circuit FF1, but may be made at the output side of the final stage flipflop circuit FF1. That is, the selector 20 is not of the 3-input but may be similar to selectors 21 and 22 and a new selector is provided at the Q-terminal of the flipflop circuit FF1. It suffices if the signal φRD is supplied to the S terminal of the selector and the redundant data from the NAND circuit 31 are supplied to the terminal B, with the A-terminal being connected to the Q-terminal and the X-terminal being connected to an output buffer. Such circuit arrangement sufficiently allows defective data to be substituted for redundant data to read out redundant data without increasing the circuit size even in case of substitution of two or more bits.

Figure 9:
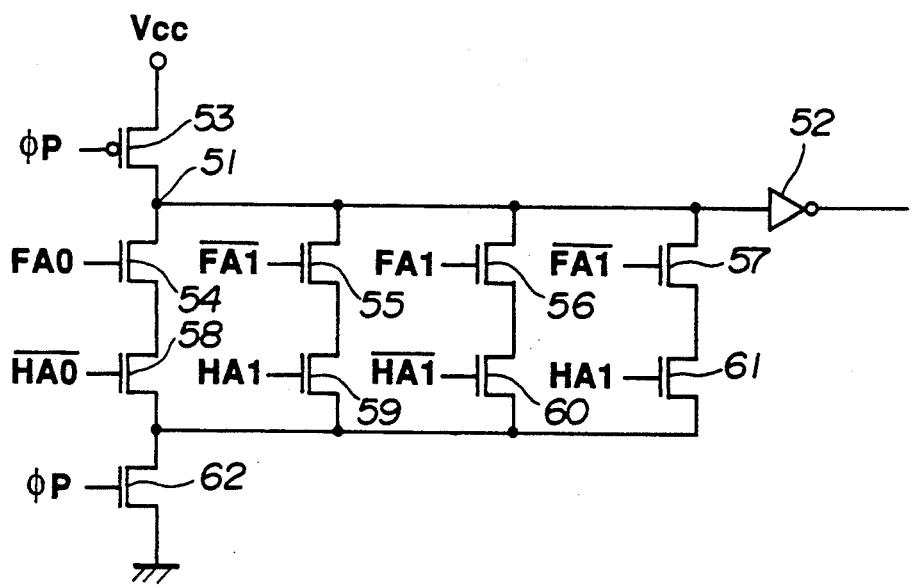
FIG. 9 is a circuit diagram showing an example of a comparator employed in an example of the memory device of the present invention.

Example of Comparator Circuit (FIG. 9)

As described above, the comparator circuit is used for comparing the defective address signal FA with read-out address signals or the like compared address signals.

FIG. 9 shows an example of the comparator circuit. Turning to the construction, a precharging pMOS transistor 53 is provided between a node 51 detecting the potential and a source voltage Vcc and is controlled by signal φP. A parallel connection of sets of paired MOS transistors connected in cascade are provided so as to be connected to node 51. nMOS transistor 54-nMOS transistor 58, nMOS transistor 55-nMOS transistor 59, nMOS transistor 56-nMOS transistor 60 and nMOS transistor 57-nMOS transistor 61 are connected in tandem as sets. With the present comparator circuit, four sets of paired MOS transistors are provided for comparing 2-bit address signals. Meanwhile, for comparing the numbers of bits of more address signals, the number of sets of the MOS transistors may be increased to 6, 8, ... and may in effect be a multiple of the number of bits of the column address signals. The sources of the nMOS transistors 58 to 61 are connected in common and supplied with the ground voltage GND via an nMOS transistor 62. A precharging signal φP is supplied to the gate of this nMOS transistor 62 similarly to pMOS transistor 53. The node 51 is to be the input terminal of an inverter 52 and the output of the inverter 52 is used for switching from defective data to redundant data as the above signal φRD as a signal indicating the results of comparison of the comparator circuit.

Turning to the signal entered to the gate of each MOS transistor, a first bit address signal FA0 of the defective address signal is entered to the gate of the nMOS transistor 54. The first-bit complementary address signal $\overline{HA0}$ of the compared address signal is entered to the gate of nMOS transistor 58. To the gate of the nMOS transistor 55 is entered a first bit complementary address signal $\overline{FA0}$ of the defective address signal. To the gate of the nMOS transistor 55 is entered the first bit complementary address signal HA0 of the compared address signal. To the gate of the nMOS transistor 56 is entered the second bit address signal FA1 of the defective address signal. To the gate of the nMOS transistor 60 is entered the second bit complementary address signal $\overline{HA1}$ of the compared address signal. To the gate of the nMOS transistor 57 is entered the second bit complementary address signal $\overline{FA1}$ of the defective address signal. To the gate of the nMOS transistor 61 is entered the second bit address signal HA1 of the compared address signal.

The operation of this comparison circuit is operation. The defective address signals FA0, $\overline{FA0}$, FA1 and $\overline{FA1}$ are supplied from the fuse ROM 5 having various constructions as will be explained subsequently. The compared address signals HA0, $\overline{HA0}$, HA1 and $\overline{HA1}$ are generated in the column counter and supplied to the comparator circuit 4.

In the operation of the comparator, assuming that the defective address signal is, for example, "01", the bits FA0 and FA1 of the bits of the defective address signal go "H" while the bits $\overline{FA0}$ and $\overline{FA1}$ are at "L" level. The compared address signals HA are changed sequentially with the operation of the column counter. It is assumed that, with the above pattern of the defective address, the compared address signal HA is "01". In this case, bit $\overline{HA0}$ and HA1 of the compared address signal go "H" while HA0 and $\overline{HA1}$ go "L".

Then, one MOS transistor of the set of cascade connected MOS transistors is turned on and the potential of the node 51 precharged by signal $\phi P$ to the source potential Vcc is maintained as is without the potential at the node 51 being discharged. Hence, in such case only, the output level of the inverter 52 goes "L". With the result of comparison of the "L" level, it is shown that the defective address signal FA coincides with the compared address signal HA.

In other cases wherein, for example, the compared address signal is "00" or "01", there is a combination wherein both of the cascade-connected MOS transistor sets are turned on, with the level at the node 51 being lowered. Thus the state of non-coincidence is indicated by the "H" level of the output of the inverter 52.

The above construction of the comparator circuit has no portion that is melted by fuse and is simply so designed as to compare the signal from the fuse ROM with the compared address signal. Therefore, when it is tried to increase the number of ports, the defective address signal from the common fuse ROM is used commonly so that it is possible to prevent the overlapping of the melting operation or increase of the circuit size.

Also, as shown in FIG. 9, the MOS transistors supplied with defective address signals and complementary address signals thereof are arrayed on the side of the cascade-connected nodes 51, so that, the charging and discharging region with respect to the nodes 51 are not enlarged even when the compared address signal progresses. That is, since the defective address signals and the complementary address signals thereof are fixed data, they are not changed as are the compared address signals. For this reason, by arraying the MOS transistors fixedly actuated by these data at the sides of the nodes 51, the region contributing to changes in potential of the node 51 may be reduced to provide for fast read-out and prevent a mistaken operation.

Figure 10:
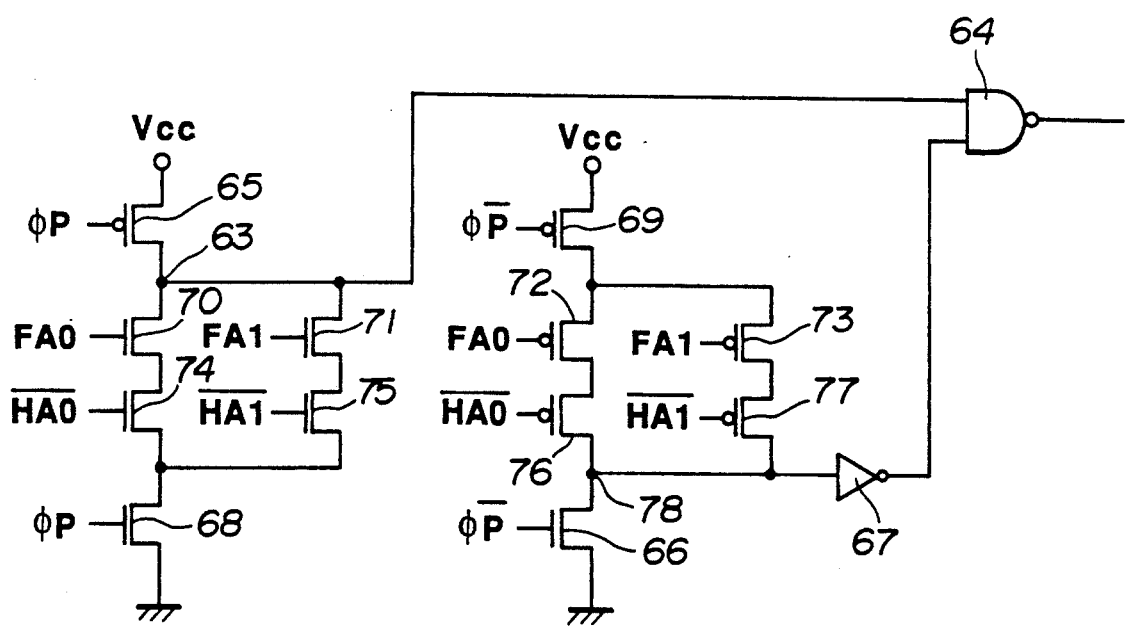
FIG. 10 is a circuit diagram showing another example of a comparator circuit employed in an example of the memory device of the present invention.

Another Example of Comparator (FIG. 10)

Referring to FIG. 10, another example of a comparator for comparing the defective address signal FA and the compared signal such as readout address signal is explained.

This comparator has an nMOS transistor 70 and an nMOS transistor 74 connected in cascade and also has an nMOS transistor 71 and an nMOS transistor 75 connected in cascade with respect to the node 63. The nMOS transistors 70, 71 are connected to the node 63. The node 63 is connected via a pMOS transistor 65 to source voltage Vcc. A signal $\phi P$ is supplied to the gate of the pMOS transistor 65 and the node 63 is precharged when the signal $\phi P$ goes to "L" level. The sources of the nMOS transistors 74, 75 are connected to ground voltage GND via nMOS transistor 68. The signal $\phi P$ is similarly supplied to the gate of this nMOS transistor 68.

The pMOS transistor 72 and the pMOS transistor 76 are connected in cascade in a set, while the pMOS transistor 73 and the pMOS transistor 77 are connected in cascade in a set, with respect to the node 78. To this node 78 are connected pMOS transistors 76, 77. The ground voltage GND is supplied to this node 78 by means of nMOS transistor 66. The signal $\phi\overline{P}$ is supplied to the gate of the nMOS transistor 66. When the signal $\phi\overline{P}$ is at "H" level, the node 78 is pre-charged to the ground Voltage GND by means of nMOS transistor 66. The signal $\phi\overline{P}$ is an inversion of the signal $\phi P$. The sources of the pMOS transistors 72, 73 are converted to the drain of the pMOS transistor 69. The source of this pMOS transistor 69 is connected to the source voltage Vcc. The signal $\phi\overline{P}$ is supplied to the gate of the pMOS transistor 69.

The node 63 is the node at which the potential is detected and is the one input of an NAND gate 64. The node 78 is also the node at which the potential is detected and is used as the other input of the NAND gate 64 by means of a inverter 67. The output of the NAND gate 64 is the signal indicating the result of comparison of the comparator.

The first bit address signal FA0 of the defective address signal is entered in the gate of nMOS transistor 70. To the gate of nMOS transistor 74 is entered the first-bit complementary address signal $\overline{HA0}$ of the compared address signal. To the gate of the nMOS transistor 71 is entered the second bit address signal FA1 of the defective address signal. To the gate of nMOS transistor 75 is supplied the second bit complementary address signal $\overline{HA1}$ of the compared address signal. To the gate of the pMOS transistor 72 is entered the first bit address signal FA0 of the defective address signal. To the gate of the pMOS transistor 76 is entered the first bit complementary address signal $\overline{HA0}$ of the compared address signal. To the gate of the pMOS transistor 73 is supplied the second-bit address signal FA1 of the defective address signal. To the gate of the pMOS transistor 77 is entered the second bit complementary address signal $\overline{HA1}$ of the compared address signal.

With the above described comparator, similarly to the comparator of FIG. 9, when the defective address signal coincides fully with the compared address signal, the current path is interrupted in any sets of the cascade-convected MOS transistor sets, so that no charging and discharging occurs at the nodes 63, 78 and the pre-charge potential is maintained. Hence, the two inputs of the NAND circuit 64 are both at "H" level, so that the output thereof is at "L" level, thus indicating that the addresses coincide as in the circuit of FIG. 9. If the defective address signal FA is not coincident with the compared address signal HA, potential at nodes 63 and 78 are changed, so that the output of the NAND circuit 64 is at "H" level.

Figure 11:
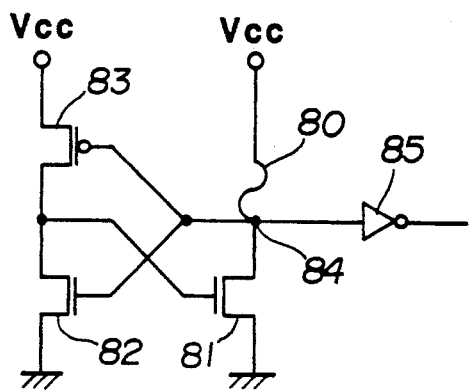
FIG. 11 is a circuit diagram showing an example of a portion of the fuse ROM employed in an example of the memory device of the present invention.

Portion of Fuse ROM (1) (FIG. 11)

FIG. 11 shows an example of a circuit constituting a fuse ROM. In the memory device of the present embodiment, a fuse that melts to store the defective address signal is provided outside the comparator.

The 1-bit construction of the fuse ROM is shown in FIG. 11. A fuse 80 and an nMOS transistor 81 are arrayed in series between the source voltage Vcc and the ground voltage GND. The source of the nMOS transistor 81 is the ground voltage GND and the source voltage Vcc is supplied to one end of the fuse 80. The output, that is the 1-bit signal of the defective address signal is taken out at a junction 84 between the fuse 80 and the nMOS transistor 81 by means of an inverter 85.

The junction 84 is connected to the gate of an nMOS transistor 82 and to a gate of a pMOS transistor 83 is constituting an inverter. The source of the pMOS transistor 83 is supplied the source voltage Vcc, while the source of the nMOS transistor 82 is supplied the ground voltage GND. The drains of the MOS transistors 82, 83, the outputs of the inverter, are connected to gate of the nMOS transistor 81.

The resistance of fuse 80 is selected to be smaller than the ON-resistance of pMOS transistor 83. As an example, the ON-resistance of the pMOS transistor 83 is several tens of k ohms, whereas the ON-resistance of the fuse 80 is several hundreds of ohms.

The circuit operation is now explained. If the fuse 80 is not melted, the junction 84 towards the fuse 80 is at "H" level when the power is turned on. The "H" level speed is higher than at the inverter side, so that the pMOS transistor 83 tends to be turned off, while the nMOS transistor 82 tends to be turned on, so that the nMOS transistor 81 is turned off and latched. Ultimately, the nMOS transistor 81 and the pMOS transistors 83 are turned off to suppress the through-current to reduce the stand-by current nearly to zero. The nMOS transistor 81 is turned off and the potential at the junction 84 is at "H" level and the output at the inverter 85 is at "L" level.

When the fuse 80 then melts, the potential at the junction 84 remains to be at "L" level when the power is turned on and the drain potential of the pMOS transistor 82 and the nMOS transistor 81 at the inverter side is at "H" level. As a result, the nMOS transistor 81 is turned on and the potential at junction 84 is latched at the ground voltage GND so that the nMOS transistor 82 is turned off. With the nMOS transistor 82 thus turned off, the stand-by current is reduced to zero.

With the above described fuse ROM circuit, the current path between the source voltage Vcc and the ground voltage GND is interrupted by the latching of the MOS transistors 81, 82 and 83, no matter whether the fuse 80 is melted or not, so that the standby current may be reduced.

Figure 12:
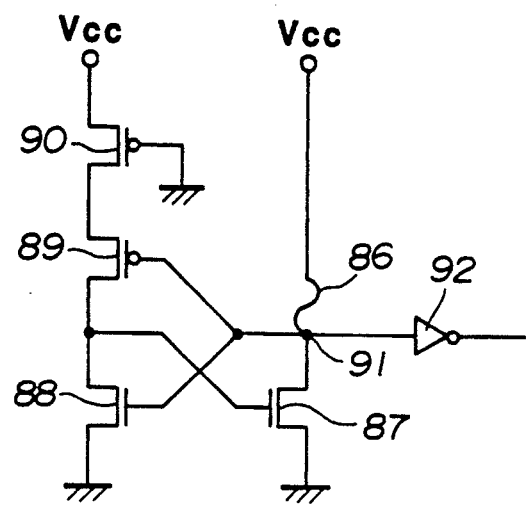
FIG. 12 is a circuit diagram showing another example of the fuse ROM.

Portion of Fuse ROM (2) (FIG. 12)

FIG. 12 shows another example of a circuit constituting a fuse ROM and a modification of the circuit of FIG. 11.

As shown in FIG. 12, showing this circuit, a fuse 86 and an nMOS transistor 87 are connected in series between the source voltage Vcc and the ground voltage GND. The source of the nMOS transistor 87 is the ground voltage GND and the source voltage Vcc is supplied to one end of fuse 86. The output, that is the 1-bit signal of the defective address signal, is taken out at a junction 91 between the fuse 86 and the nMOS transistor 87 via an inverter 92.

The junction 91 is also connected to the gate of the nMOS transistor 88 and the gate of the pMOS transistor 89 constituting an inverter. The source of the pMOS transistor 89 is connected to the drain of the pMOS transistor 90, functioning as the load resistor, and the source voltage Vcc is supplied to the source of this pMOS transistor 90. The ground voltage GND is applied to the gate of this pMOS transistor 90. The source of this pMOS transistor 88 is the ground voltage GND. The drains of the MOS transistors 89, 88, which are the outputs of this inverter, are connected to the gate of the nMOS transistor 87.

In the above circuit construction, comparison with the circuit of FIG. 11 reveals that the pMOS transistor 90 has been annexed at the source side of the pMOS transistor 89. By such addition of the pMOS transistor 90 having its gate as the ground voltage GND, the junction 91 can be positively brought to "H" level when the power is turned on when the fuse is not melted. That is, when the power is turned on, the voltage at the source of the pMOS transistor 90 is maintained at 0 V until the source voltage Vcc exceeds the threshold voltage Vth of the pMOS transistor, so that the potential at the junction 91 is raised positively.

Similarly to the circuit of FIG. 11, the standby current can be reduced sufficiently by latching no matter whether or not the fuse 86 is melted.

Figure 13:
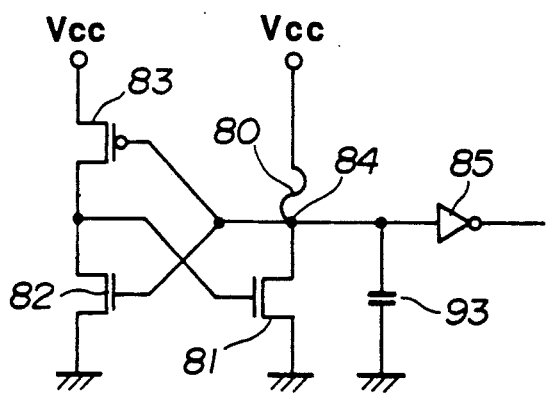
FIG. 13 is a circuit diagram showing a modification of the example of FIG. 11.

Portion of the fuse ROM (3) (FIG. 13)

FIG. 13 shows a further example of a circuit constituting the fuse ROM and comprises a capacitor 93 annexed to the circuit of FIG. 11. The construction similar to that of FIG. 11 is of FIG. 11. The construction similar to that of FIG. 11 is corresponding description is omitted for simplicity.

This capacitor 93 is provided between the junction 84 and the ground voltage line. By providing the capacitor 93 in this manner, the potential at the junction 84 may be positively set to the "L" level by capacitive connection with the ground voltage GND on melting of the fuse 80.

The standby current can naturally be lowered as in the circuit of FIG. 11.

Figure 14:
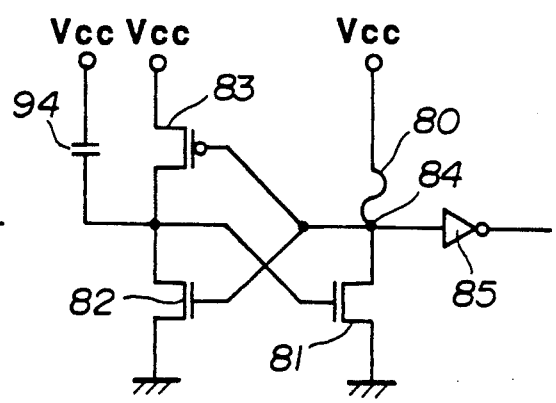
FIG. 14 is a circuit diagram showing another modification of the example of FIG. 11.

Portion of Fuse ROM (4) (FIG. 14)

FIG. 14 shows a further example of the circuit constituting the fuse ROM and comprises a capacitor annexed to the circuit of FIG. 11. The construction similar to that of FIG. 11 is represented by the same reference numeral and the corresponding description is omitted.

This capacitor 94 is provided between the power voltage line and the junction between the inverter side pMOS transistor 83 and the nMOS transistor 82. By providing the capacitor 94 in this manner, the inverter output level may be raised towards the source voltage Vcc, so that the potential at the junction 84 may be brought positively to the "L" level.

The standby current can naturally be reduced similarly to the circuit of FIG. 11.

Figure 15:
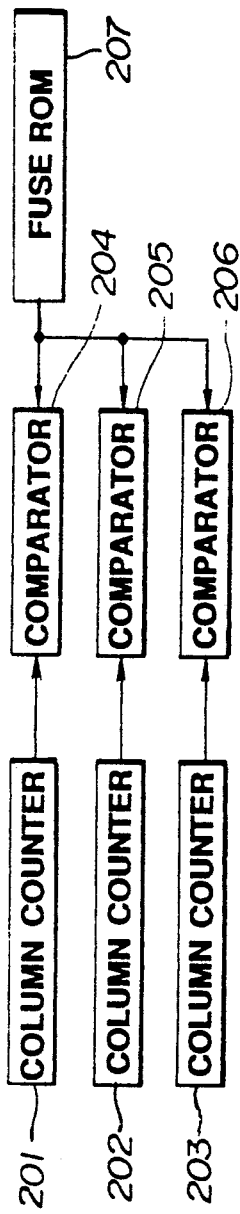
FIG. 15 shows the connection in the case of three ports of the comparators or the like employed in the example of the memory device of the present invention.
Figure 16:
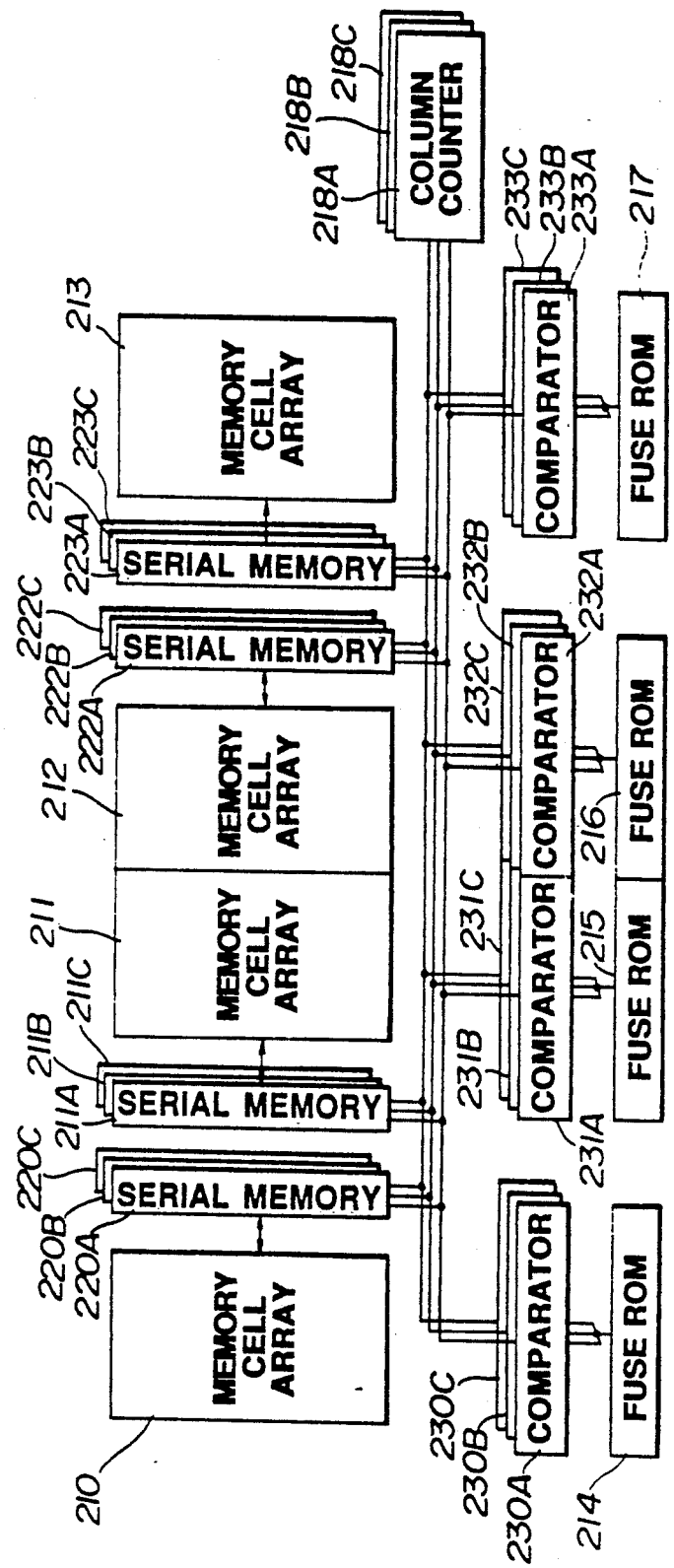
FIG. 16 is a block circuit when the example of the memory device of the present invention is of the three-port construction.

Construction of Multiport Memory Device (FIGS. 15 and 16)

With the memory device of the present embodiment, as described above, the comparator for comparing the compared address signals such as the write or read addresses and the defective address signals is separate from the fuse ROM storing the defective address signal. When the memory device includes a plurality of serial memories, the fuse ROMs may be used in common.

FIG. 15 shows the construction of a comparator in which three ports, that is three serial memories are controlled asynchronously.

With this construction, the three serial memories are controlled independently, so that three column counter circuits 201, 202 and 203 are provided separately and each output address signals for column selection of the memory cell array as required. Three comparators 204, 205 and 206 are provided in association with the serial memories and are supplied with compared signals from the column counter circuits 201, 202 and 203. Only one fuse ROM 207, having the above mentioned fuse and outputting defective address signals stored by the melting pattern, is provided in correspondence to the number of the memory cell array without correspondence to the number of serial memories. That is, since the defective address signal is determined in association with the memory cell array, it is outputted to the comparators 204, 205 and 206 from the exclusive fuse ROM 207 in the form of electrical signals, so that switching between the defective data and the redundance data in the three separate serial memories may be made with only one fuse ROM.

FIG. 16 shows the overall construction of the memory device divided into blocks. In the present example, the memory cell array is divided into four portions, with the fuse ROMs 214, 215, 216 and 217 corresponding to the memory cell arrays 210, 211, 212 and 213, respectively. Three serial memories are provided for each of the memory cell arrays 210, 211, 212 and 213, divided into the blocks. Serial memories 220A, 220B and 220C are provided for the memory cell array 210, serial memories 221A, 221B and 221C are provided for the memory cell array 211, serial memories 222A, 222B and 222C are provided for the memory cell array 212, and serial memories 223A, 223B and 223C are provided for the memory cell array 213. These serial memories 220A, 220B, 220C—223A, 223B and 223C are respectively provided with comparators 230A, 230B, 230C—233A, 233B and 233C and switching between the defective data and the redundant data is performed by, for example, the signals $\phi$RD from the comparators 230A, 230B, 230C—233A, 233B and 233C.

From a column counter circuit 218A, among the three column counter circuits, address signals are transmitted to serial memories 220A, 221A, 222A and 223A, respectively; from a column counter circuit 218B, address signals are transmitted to serial memories 220B, 221B, 222B and 223B, respectively; and from a column counter circuit 218C, address signals are transmitted to serial memories 220C, 221C, 222C and 223C, respectively.

With the above described memory device, if we direct attention to the routes of the defective and compared address signals entered to the comparators 230A, 230B, 230C—233A, 233B and 233C, the comparators 230A, 231A, 232A and 233A are supplied with the compared signals from the column counter circuit 218A, the comparators 230B, 231B, 232B and 233B are supplied with the compared address signals from the column counter circuit 218B and the comparator circuits 230C, 231C, 232C and 233C are supplied with the compared address signals from the column counter circuit 218C. However, the defective address signal is supplied from the fuse ROM 214 to comparators 230A, 230B and 230C, the defective address signals are supplied from the fuse ROM 215 to the comparators 231A, 231B and 231C, the defective address signals are supplied from the fuse ROM 216 to the comparators 232A, 232B and 232C and the defective address signals are supplied to the fuse ROM 217 from the comparators 233A, 233B and 233C.

In this manner, even if the separate memory cell arrays 210 to 213 are each provided with separate three serial memories 220A, 220B, 220C—223A, 223B and 223C, the fuse ROM need to be provided in a number corresponding to the memory cell array. Hence, even with the above described multi-port construction, the overlapped melt fusing operation may be eliminated and switching between the defective data and the redundance data may be achieved positively with the memory device provided with serial memories.

What is claimed is:

1. A semiconductor memory device for reading out serial data stored therein, comprising:
   a plurality of memory cells arranged in a two-dimensional matrix array of rows and columns,
   column redundancy means for storing data in lieu of a defective memory cell of the array, being located adjacent the array, having a plurality of memory cells in which the number of rows of the memory cells therein is equal to that of the array,
   selecting means for selecting one of the rows of the array and the column redundancy means simultaneously to output data from the array and the column redundancy means in parallel in responsive to a readout address signal,
   controlling means for generating a switching control signal by comparing a defective address signal with the readout address signal,
   parallel-serial converting means for inputting the data from the array and the column redundancy means and for outputting the data in series, comprising:
   a plurality of flip-flop circuits connected in series, in which the final stage of the flip-flop circuits outputs the data in series,
   a plurality of selectors for selecting data from the array and from the flip-flop circuit, being provided between the flip-flop circuits, wherein one of the selectors which is associated with the final stage selects the data from the column redundancy means and the data from the array or the flip-flop circuit in responsive to the switching control signal.

2. A semiconductor memory device according to claim 1, wherein the controlling means includes a fuse read only memory in which the defective address signal according to the defective memory cell is stored, and comparing means for comparing the defective address signal from the fuse read only memory with the readout address signal.

3. A semiconductor memory device according to claim 2, wherein the comparator comprising:
   a plurality of sets of a pair of MOS transistor, the sets being connected in parallel between a first potential and second potential, one of MOS transistor of a pair being controlled by the defective address signal or a complemental defective address signal, the other of MOS transistor of a pair being controlled by the readout address signal or a complemental readout address signal, the number of the sets being equal to the twice of the bit number of the address signals.

4. A semiconductor memory device according to claim 3, wherein the MOS transistors controlled by the defective address signal or the complemental defective address signal are connected to a node which is connected to the first potential via a pre-charge transistor pre-charging the node to the first potential, and wherein the switching control signal reflects a level of the node.

5. A semiconductor memory device according to claim 2, wherein the parallel-serial converting means consists of a plurality of parallel-serial converters operating asynchronously, and wherein the comparing means consists of a plurality of comparators comparing the defective address signal from the fuse read only memory with the readout address signals generated asychronously from a plurality of column counters.

6. A semiconductor memory device according to claim 2, wherein the array of the memory cells is divided into a plurality of memory blocks, and wherein the controlling means includes a plurality of fuse read only memories each corresponding to the respective memory blocks.

7. A semiconductor memory device according to claim 2, wherein the fuse read only memory comprises at least a cell storing a data of 1 bit, the cell including a fuse and a MOS transistor which are connected in series between a first potential and a second potential, the gate of the MOS transistor being supplied with a level which is an inverted level of the node between the fuse and the MOS transistor.

8. A semiconductor memory device according to claim 7, wherein the level which is supplied to the gate is produced by a inverter having a complementary MOS transistor structure.

9. A semiconductor memory device according to claim 1, further comprising the column redundancy means having a plurality of columns of memory cell, a redundant data buffer for storing parallel data from the column redundancy means, and a redundant selector for selecting the data from the parallel data of the redundant data buffer in corresponding to a signal from the controlling means to output to the selector being associated with the final stage.

10. A semiconductor memory device comprising,
a plurality of memory cells arranged in a two-dimensional matrix array of rows and columns,
column redundancy means for storing data in lieu of a defective memory cell of the array, being located adjacent the array, having a plurality of columns of memory cells,
selecting means for selecting one of the rows of the array and the column redundancy means simultaneously to output data from the array and the column redundancy means in parallel in responsive to a readout address signal,
a data buffer for storing parallel data from the array,
a redundant data buffer for storing parallel data from the column redundancy means,
a read only memory in which the defective address signal according to the defective memory cell is stored,
comparing means for comparing the defective memory address signal from the read only memory with the readout address signal, and generating a switching control signal and a redundant selector control signal,
parallel-serial converting means for inputting the data from the data buffer and the redundant data buffer and for outputting the data in series, comprising; a plurality of flip-flop circuits connected in series, in which the final stage of the flip-flop circuits outputs the data in series, and a plurality of selectors for selecting data from the array and from the flip-flop circuits, being provided between the flip-flop circuits, wherein one of the selectors which is associated with the final stage selects the data from the column redundancy means, the data from the array and the data from the flip-flop circuits in responsive to the switching control signal, and
a redundant selector for selecting the data from the parallel data of the redundant buffer corresponding to the redundant selector control signal to output to the selector being associated with the final stage.

* * * * *